(12) United States Patent
Ren

(10) Patent No.: US 7,446,027 B2
(45) Date of Patent: Nov. 4, 2008

(54) METHOD FOR FORMING GATE STRUCTURE WITH LOCAL PULLED-BACK CONDUCTIVE LAYER AND ITS USE

(75) Inventor: Chiang Yuh Ren, Hsinchu (TW)

(73) Assignee: Promos Technologies Inc. (TW)

( * ) Notice: Subject to any disclaimer, the term of this patent is extended or adjusted under 35 U.S.C. 154(b) by 0 days.

(21) Appl. No.: 11/763,753

(22) Filed: Jun. 15, 2007

(65) Prior Publication Data

US 2008/0166866 A1    Jul. 10, 2008

(30) Foreign Application Priority Data

Jan. 10, 2007    (TW)    ............... 96100946 A

(51) Int. Cl.
*H01L 21/3205*    (2006.01)
*H01L 21/4763*    (2006.01)

(52) U.S. Cl. .................. 438/592; 438/588; 438/595; 257/E29.159; 257/E21.636; 257/E21.638

(58) Field of Classification Search ............... 438/588, 438/592, 595; 257/E29.159, E21.636, E21.638
See application file for complete search history.

(56) References Cited

U.S. PATENT DOCUMENTS

| | | | | |
|---|---|---|---|---|
| 5,545,578 A | * | 8/1996 | Park et al. | ............... 438/303 |
| 5,989,987 A | * | 11/1999 | Kuo | ............... 438/592 |
| 6,486,067 B1 | * | 11/2002 | Shen et al. | ............... 438/704 |
| 6,762,101 B2 | * | 7/2004 | Chan et al. | ............... 438/283 |
| 6,855,610 B2 | | 2/2005 | Tung et al. | |

* cited by examiner

*Primary Examiner*—Michelle Estrada
(74) *Attorney, Agent, or Firm*—Holland & Knight LLP; Brian J Colandreo, Esq.

(57) ABSTRACT

A method for forming a gate structure with a pulled-back conductive layer and the use of the method are provided. The method conducts a local, not global, pull-back process on the conductive layer of the gate structure at the position intended for contact window formation, wherein the pull-back process is conducted after rapid thermal oxidation to prevent CBCB short, CB open and/or CBGC short.

31 Claims, 10 Drawing Sheets

METHOD FOR FORMING GATE STRUCTURE WITH LOCAL PULLED-BACK CONDUCTIVE LAYER AND ITS USE

CROSS-REFERENCE TO RELATED APPLICATION(S)

This application claims priority to Taiwan Patent Application No. 096100946 filed on 10 Jan. 2007, the disclosure of which is incorporated herein by reference in its entirety.

BACKGROUND

1. Field of the Invention

The present invention relates to a method for forming a gate structure with a local pulled-back conductive layer. In particular, a contact window that avoids the disadvantage of the prior art, such as short circuiting between the bit line contact and gate conductor (CBGC short), broken bit line contacts (CB open) and/or short circuiting of the bit line contacts (CBCB short), is formed.

2. Descriptions of the Related Art

A metal oxide semiconductor (MOS) device is normally composed of a metal layer, a silicon oxide layer, and a substrate. Because the adhesion between the metal and oxide is poor, a polysilicon material is often used as a substitution for metal when forming the conductive layer of an MOS device.

It is known that the resistance of a polysilicon material is higher than that of metal. Although impurities are doped onto the polysilicon layer for reducing resistance, the conductivity is still not high enough for good conductivity in a gate structure. Typically, a metal silicide layer, such as a tungsten silicide (WSi) layer, is added onto the polysilicon layer to improve the conductivity of the gate structure.

A contact window is formed alongside of the gate structure to form electrical connects between the metal layer of the bit line and substrate. A conventional method for forming a contact window will be described as follows. First, in reference to FIG. 1A, a substrate 102 is provided. A gate structure 103 is formed on the substrate 102, wherein the gate structure 103 comprises a first conductive layer 104, a second conductive layer 106, an insulation layer 108 and spacers 110. Then, a dielectric layer 112 is formed to cover the entire substrate 102 and gate structure 103. The first conductive layer 104 can be a polysilicon layer or an amorphous silicon layer, while the second conductive layer 106 can be a metal silicide layer.

In FIG. 1B, a selected portion of the dielectric layer 112 is removed by performing lithographic and etching processes until the surface of the substrate 102 has been exposed. As a result, a contact window 114 is formed. In FIG. 1C, a metal layer 116 is deposited over the dielectric layer 112, and the side walls and bottom of the contact window 114 to form a metal contact.

If the insulation layer 108 and the spacer 110 were overly etched due to improper control, the deposition of the metal layer would expose the second conductive layer 106 under the insulation layer 108. In addition, the second conductive layer 106 may be exposed if the second conductive layer 106 pierces the spacer 110 due to thermal strain caused by a subsequent thermal process. Thus, in reference to FIG. 1D, the exposed second conductive layer 106 connects to the metal layer 116 and forms an electrical connection 118 (as shown in the dotted line area) thereto, and thus, causes a short circuit between the bit line contact and gate conductor (CBGC short).

To solve the above-mentioned problem of an exposed second conductive layer 106, a method is disclosed in U.S. Pat. No. 5,989,987. In FIG. 2A, a substrate 202 is provided where a gate structure 203 is formed on the substrate 202. The gate structure 203 comprises a first conductive layer 204, a second conductive layer 206, and an insulation layer 208. The first conductive layer 204 can be a polysilicon layer or an amorphous silicon layer. Next, a pull back process is conducted by using an etchant to etch the second conductive layer 206, wherein the etchant is a mixture of $NH_4OH$, $H_2O_2$ and $H_2O$.

In FIG. 2B, spacers 210 are formed on the sides of the gate structure 203. Then, FIG. 2C shows a dielectric layer 212 that covers the entire substrate 202 and gate structure 203. A selected portion of the dielectric layer 212 is removed by performing lithographic process and etching processes to expose a portion of the surface of the substrate 202. As a result, a contact window 214 is formed.

In FIG. 2D, a metal layer 216 is formed to cover the dielectric layer 212 and the side walls and bottom of the contact window 214. In this way, a metal contact is formed.

In the method disclosed in U.S. Pat. No. 5,989,987, the second conductive layer 206 of the gate structure is etched globally. In other words, portions of the second conductive layer 206 that do not need to be removed for forming the contact window are also etched away. This etching is disadvantageous in several ways. First, because the second conductive layer 206 is oxidized and has an increased thickness during rapid thermal oxidation, the reduced space in the contact window can cause the bit line contact to break. Second, a short circuit between the bit line contacts may occur. This occurs when the space between the adjacent gate structures, not used for forming the contact window, are increased by the global etching. While the space is filled with a dielectric material, cavities may be formed in the dielectric material. Such cavities may be filled with conductive material when the conductive material is deposited into the contact windows for forming contact plugs. As a result, short circuiting may occur. Third, the resistance of the gate conductive is increased because the cross-sectional area of the conductive layer of the gate structure is reduced. Fourth, because the contact area between the first conductive layer 204 and the second conductive layer 206 is reduced, peeling will be induced in subsequent processes.

TW 544787 describes another method. First, FIG. 3A illustrates a substrate 302 in which the gate structures 303 are formed on the substrate 302. Each gate structure 303 comprises a first conductive layer 304, a second conductive layer 306 and an insulation layer 308, wherein the first conductive layer 304 can be a polysilicon layer or an amorphous silicon layer. A photoresist layer 309 is deposited over the substrate 302 and gate structures 303.

Next, FIG. 3B illustrates a bit line contact node mask or a bit line contact mask used to perform a lithographic and etching process to remove a portion of the photoresist layer 309 between the adjacent gate structures 303. As a result, an opening is formed. Then, an etching process is applied using an etchant to pull back the exposed second conductive layer 306.

In FIG. 3C, the photoresist layer 309 is removed and spacers 310 are formed on the sides of the gate structures 303. Then, in FIG. 3D, a dielectric layer 312 is formed to cover the substrate 302 and gate structures 303. Lithographic and etching processes are performed to remove a selected portion of the dielectric layer 312 to expose the substrate 302. In this way, a contact window 314 between adjacent gate structures 303 is formed.

Lastly, in reference to FIG. 3E, a metal layer 316 is formed to cover the dielectric layer 312 and the side walls and bottom of the contact window 314 to provide a metal contact.

As described above, the method of TW 544787 comprises a step of locally etching the second conductive layer 306 of the gate structure 303. Accordingly, the portion of the second conductive layer 306, on which a contact window is not going to be formed, will not be etched away. This method can solve the aforementioned problems, such as short circuiting between the bit line contacts and peeling. Nevertheless, the method of TW 544787 still has several disadvantages.

Specifically, in TW 544787, after the contact window is formed, the second conductive layer 306 will be oxidized during subsequent processes, such as rapid thermal oxidation, and will result in a thicker layer 306. A thickened layer 306 will decrease the space of the contact window and thus, causes a broken bit line contacts (CB open). Furthermore, the method has to increase the number of masks or change the thermal budget to provide additional patterns for the lithographic and etching process illustrated in FIG. 3B to pull-back the second conductive layer 306. Moreover, the lithographic and etching process illustrated in FIG. 3B involve a wet and high temperature procedure that is performed over a long period of time using a photoresist as the hard mask. However, the photoresist becomes relatively weak due to the exposure to high temperatures and moisture during the lengthy process. In other words, the photoresist can be easily damaged during high temperature and/or wet processes. Hence, the etchant used in the etching process may permeate into the gate structure along the interface between the photoresist and the gate structure, and thereby, etching others portions that need not to be etched.

Given the above descriptions, it is important to find an effective process that will not result in short circuiting between the bit line contact and gate conductor (CBGC short), a broken bit line contact (CB open) and/or short circuiting between the bit lines contacts (CBCB short) for gate structures with a pulled-back conductive layer.

SUMMARY OF THE INVENTION

An objective of the present invention is to provide a method of forming a gate structure with a local pulled-back conductive layer. The method comprises the following steps: providing a substrate having a gate structure, wherein the gate structure has a first side wall and a second side wall and comprises the following layers from bottom to top: a first conductive layer, a second conductive layer, and an insulation layer; forming a protection layer on the first and second sidewalls of the gate structure to cover the first conductive layer and the second conductive layer; removing a portion of the protection layer from the first side wall to expose the second conductive layer; and performing an etching to pull-back the exposed second conductive layer.

Another objective of the present invention is to provide a method for forming a contact window structure with a local pull back conductive layer. The method comprises the following steps: providing a substrate with a plurality of gate structures, wherein each of the gate structures comprises the following layers from bottom to top: a first conductive layer, a second conductive layer, and an insulation layer; forming a protection layer on a side wall of the each gate structure to cover the first conductive layer and the second conductive layer; removing a portion of the protection layer from each of the adjacent side walls of the selected adjacent gate structures to expose the second conductive layer of each of the selected adjacent gate structures; performing an etching to pull-back the exposed second conductive layer, forming a spacer on each side of each selected adjacent gate structures, and forming a dielectric layer to cover the substrate and the gate structures; and removing a portion of the dielectric layer located at a position between the selected adjacent gate structures.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1A:
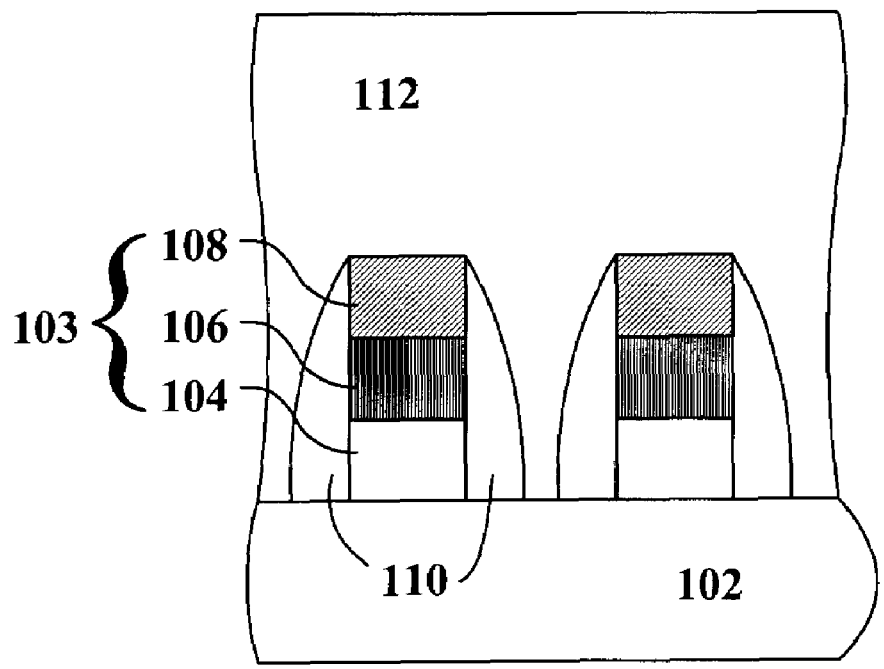
FIG. 1A to FIG. 1D illustrate the steps of a conventional method for forming a contact window.
Figure 1B:
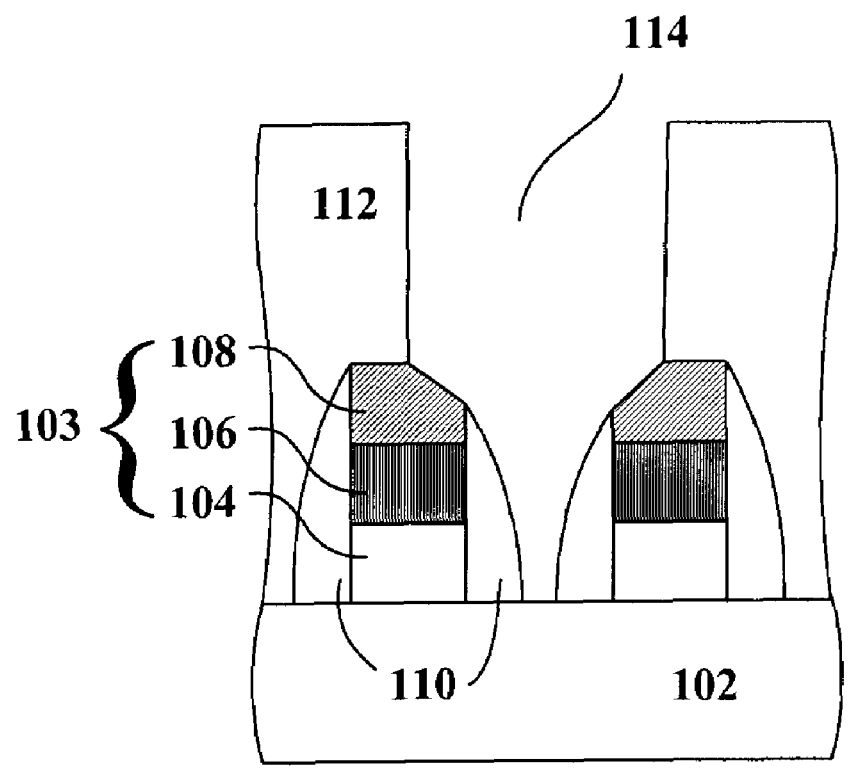
Figure 1C:
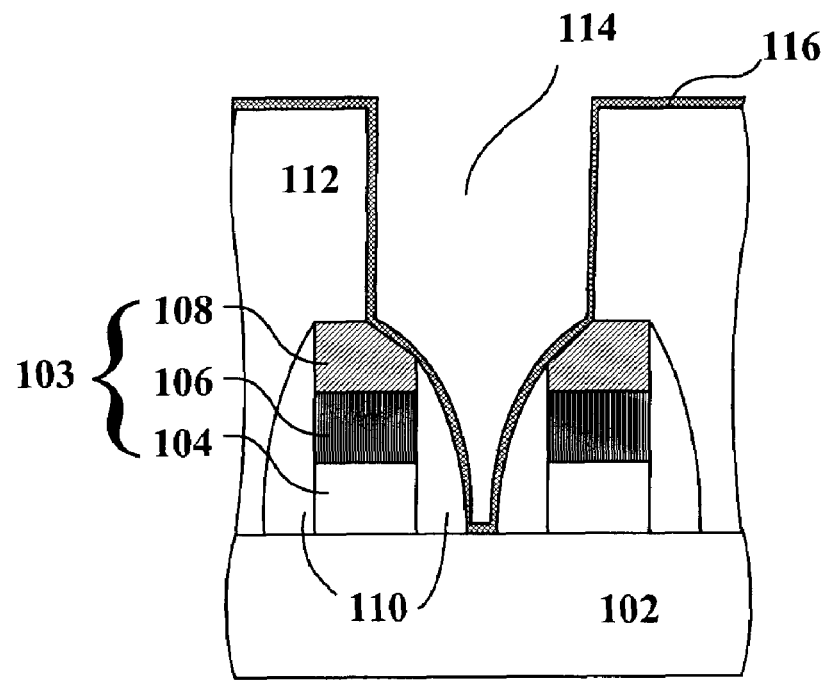
Figure 1D:
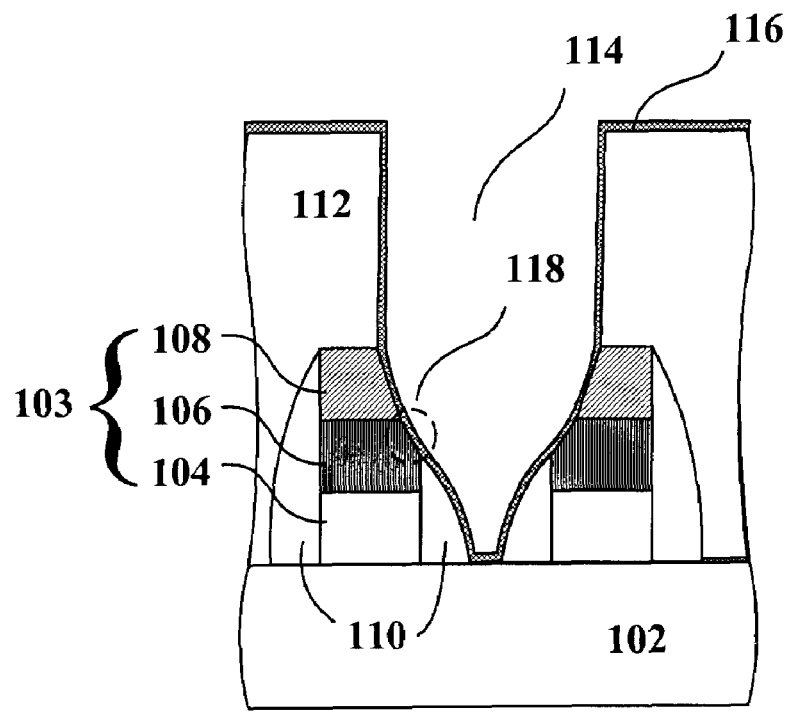
Figure 2A:
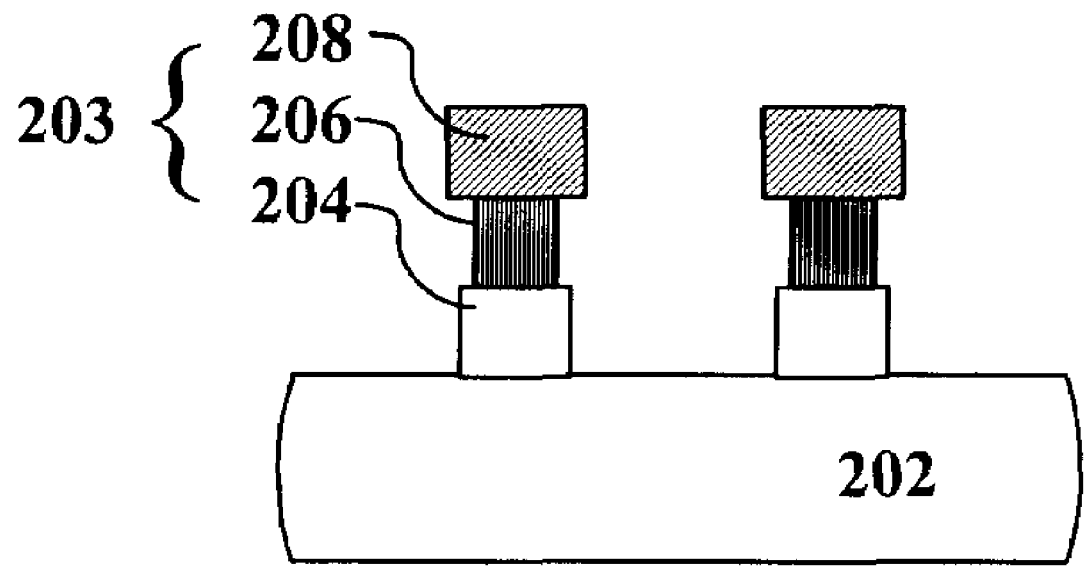
FIG. 2A to FIG. 2D illustrate the steps of another conventional process for forming a contact window.
Figure 2B:
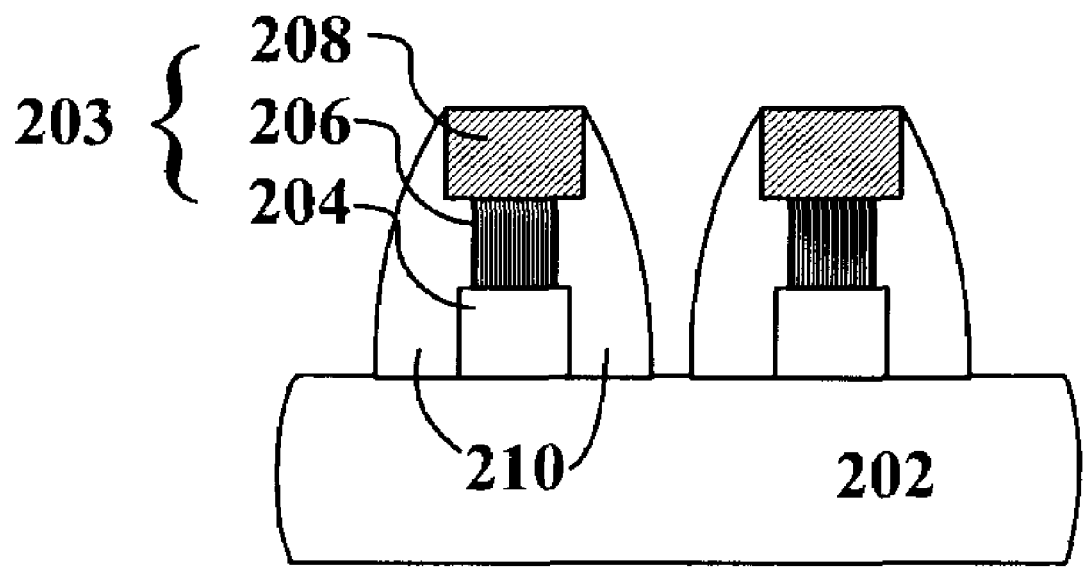
Figure 2C:
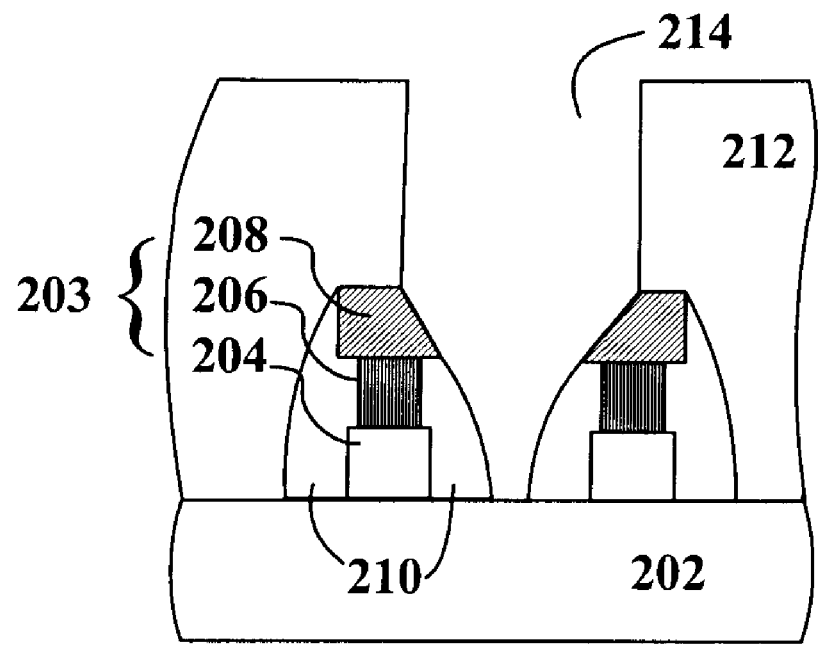
Figure 2D:
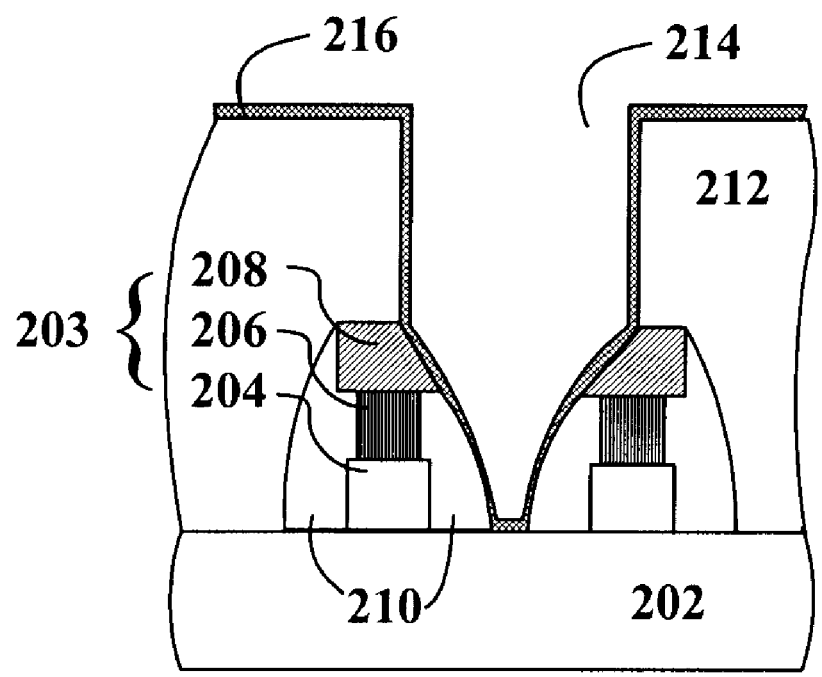
Figure 3A:
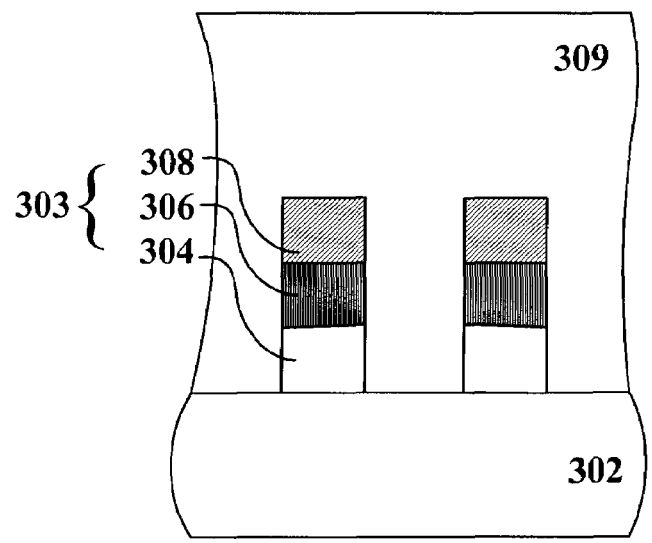
FIG. 3A to FIG. 3E illustrate the steps of yet another conventional process for forming a contact window.
Figure 3B:
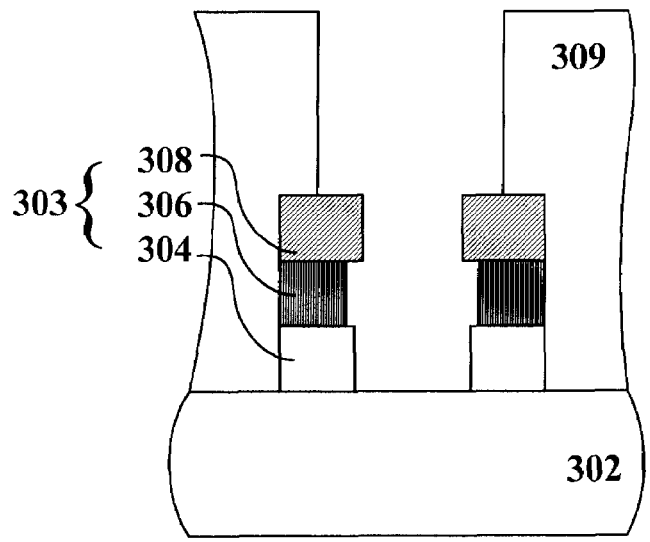
Figure 3C:
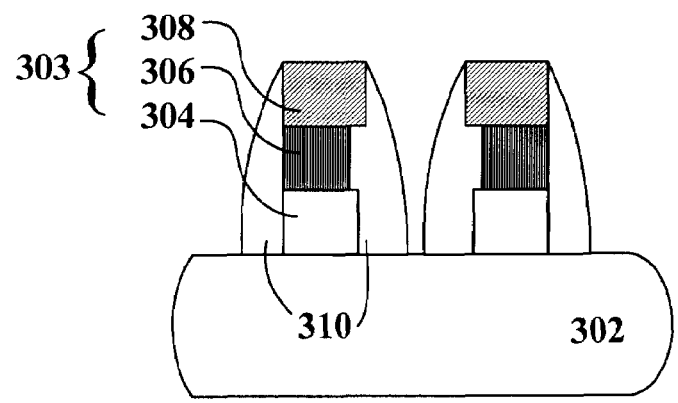
Figure 3D:
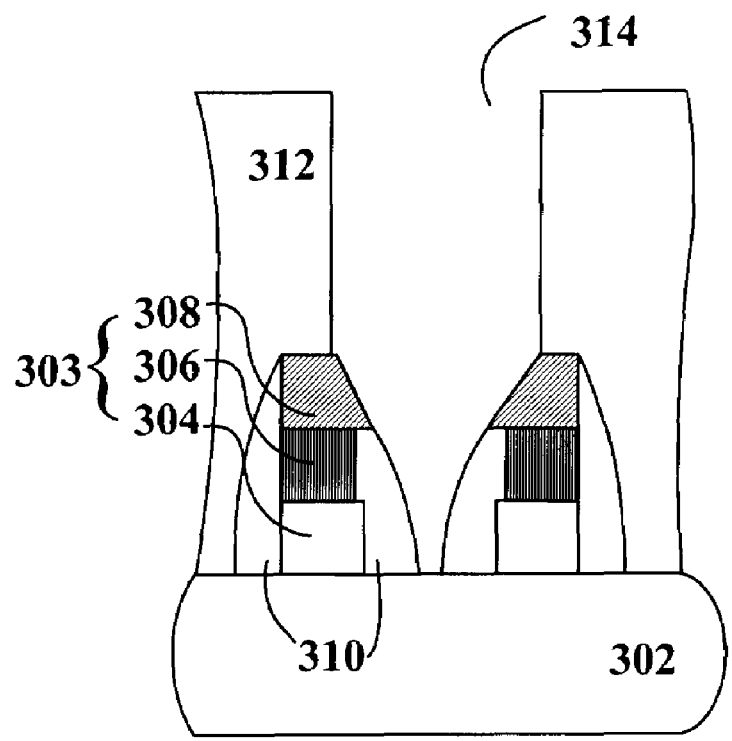
Figure 3E:
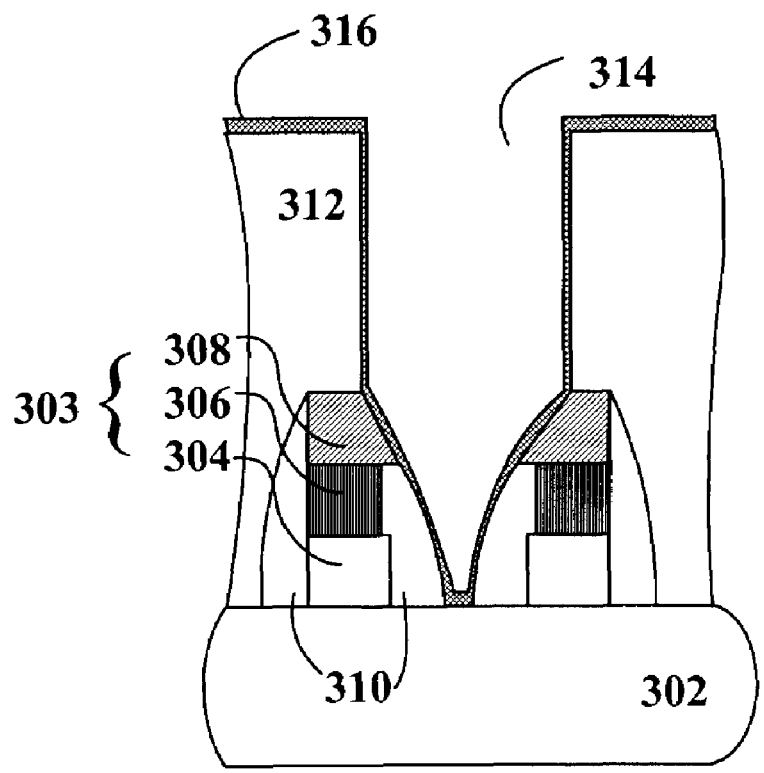
Figure 4:
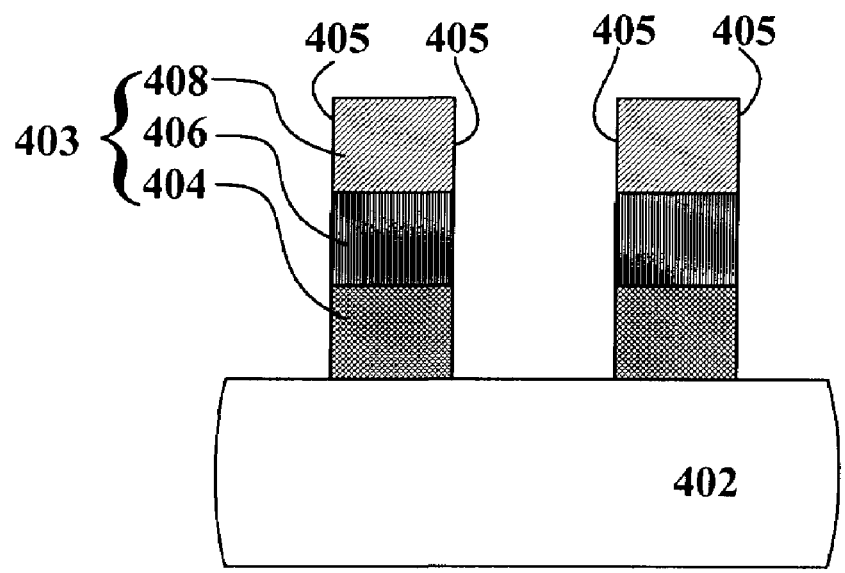
FIGS. 4, 5, 6A to 6C, 7A and 7B illustrate an embodiment according to the present invention.

First, as shown in FIG. 4, a substrate 402 with a plurality of gate structures 403 is provided. Each structure 403 has two side walls 405 and comprises the following layers from bottom to top: a first conductive layer 404, a second conductive layer 406, and an insulation layer 408. The first conductive layer 404 can be a polysilicon layer or an amorphous silicon layer. The second conductive layer 406 can be a metal silicide layer, such as a tungsten silicide layer. The insulation layer 408 can be a silicon nitride layer.

Figure 5:
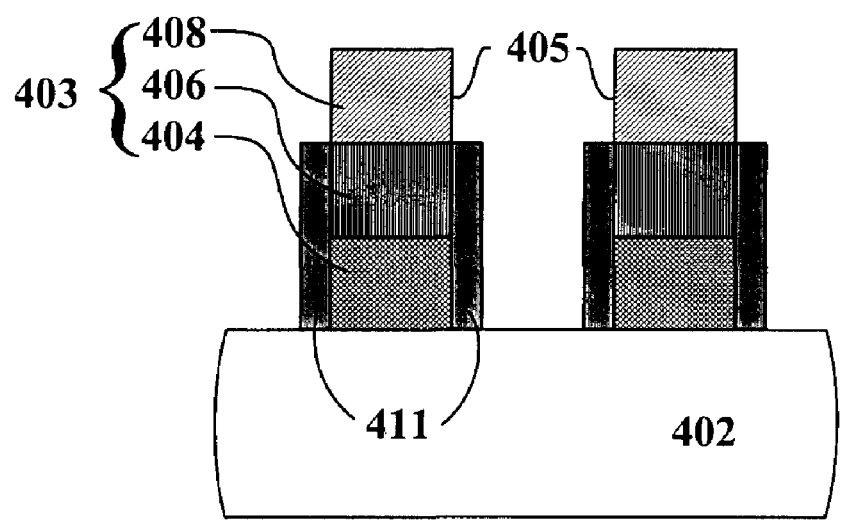

In FIG. 5, a protection layer 411 is formed on the side walls 405 of the gate structure 403 to cover the first conductive layer 404 and the second conductive layer 406. The protection layer 411 can be an oxide layer formed by rapid thermal oxidation.

Figure 6A:
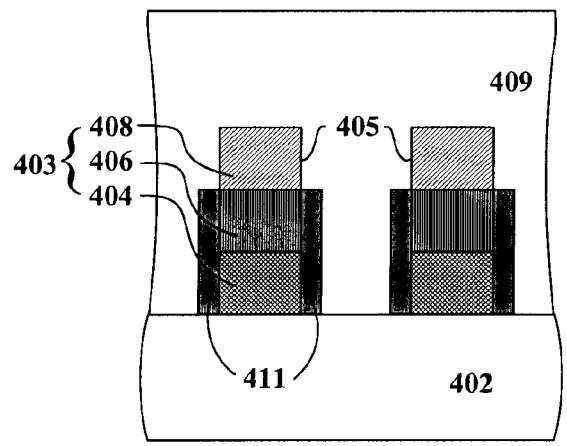
Figure 6B:
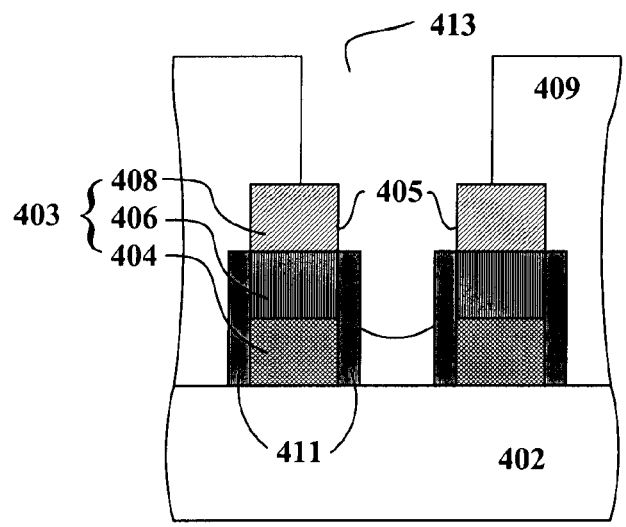
Figure 6C:
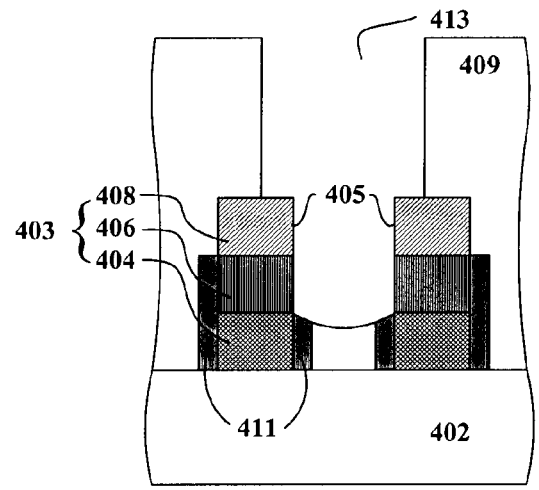

Thereafter, a portion of the protection layer 411 is removed from each of the adjacent side walls 405 of the adjacent gate structures 403 to expose the second conductive layer 406. For instance, as shown in FIG. 6A, a photoresist layer 409 is deposited over the substrate 402 and the gate structures 403. Next, as shown in FIG. 6B, lithographic and etching processes are performed to remove a portion of the photoresist layer 409 from the region between the adjacent gate structures 403 and to form an opening 413, wherein the height of the photoresist layer 409 in the opening is not higher than the first conductive layer 404. Optionally, an anti-reflective layer (not shown) is deposited prior to the deposition of the photoresist layer 409. In this case, the anti-reflective layer or both the anti-reflective layer and photoresist layer 409 are remained in the opening. In FIG. 6C, an appropriate etchant, such as diluted HF, is used to etch away a portion of the protection layer 411 that is not covered by the photoresist layer 409 or the anti-reflective layer (if present) from the adjacent side walls 405. As a result, a portion of the protection layer 411 is removed from the adjacent side walls 405 of the adjacent gate structures 403 and the second conductive layer 406 is exposed.

Figure 7A:
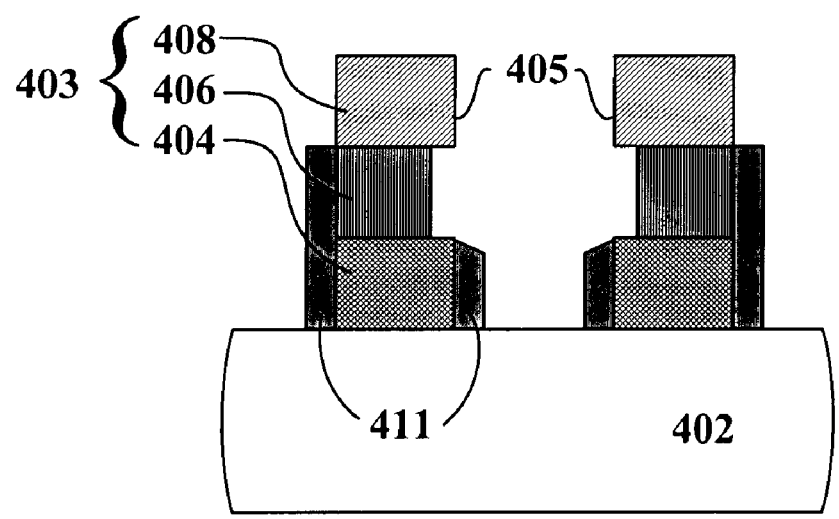
Figure 7B:
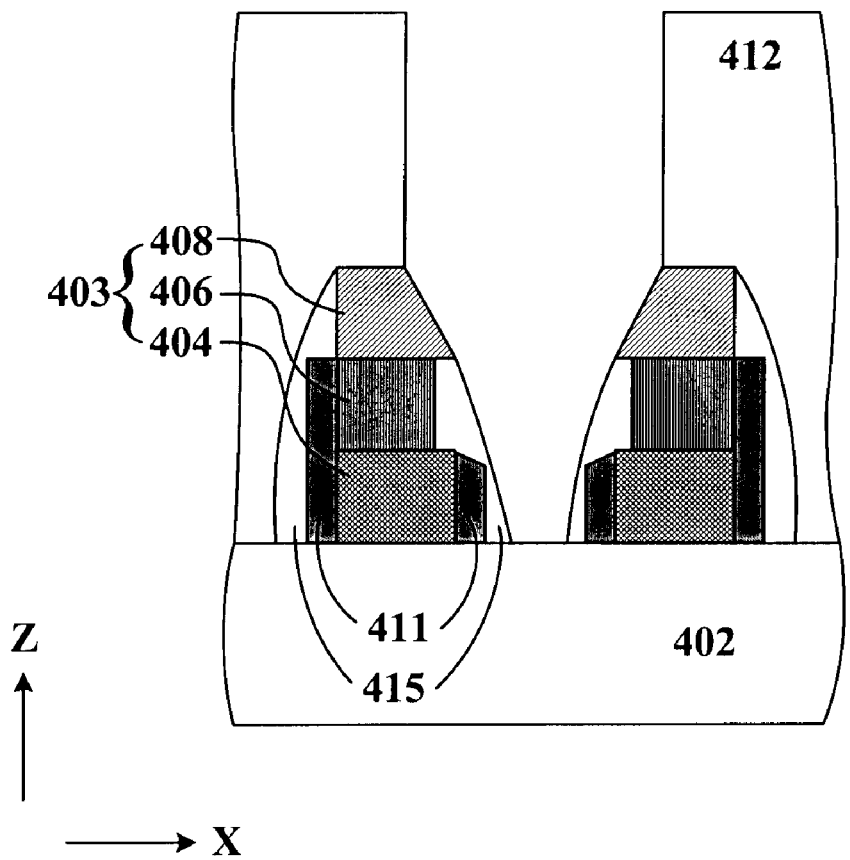

In FIG. 7A, the photoresist layer 409 (and anti-reflective layer, if present) is removed from the substrate 402. Then, an isotropic etching process is performed using an etchant whose etching rate is higher in the second conductive layer 406 than in the insulation layer 408, protection layer 404, and first conductive layer 411. The exposed second conductive layer 406 is then etched so that the gate structure 403 has a local pulled-back conductive layer. For instance, an HA solution (NH$_4$OH+H$_2$O$_2$+H$_2$O) can serve as the etchant to perform the isotropic etching process, in which the insulation layer 408 is a silicon nitride layer, the first conductive layer 404 is a polysilicon layer and the second conductive layer 406 is a tungsten silicide layer. In FIG. 7B, spacers 415 are formed on the sides of the gate structure 403 and a dielectric layer 412 is deposited over the substrate 402 and the gate structure 403. Lithographic and etching processes are performed to remove portions of the dielectric layer 412 from the region where the bit line contact window will be formed until the substrate 402 is exposed. As a result, a contact window is formed. Optionally, a self-aligned etching process can be adopted to form a self-aligned contact window in this step.

Figure 8:
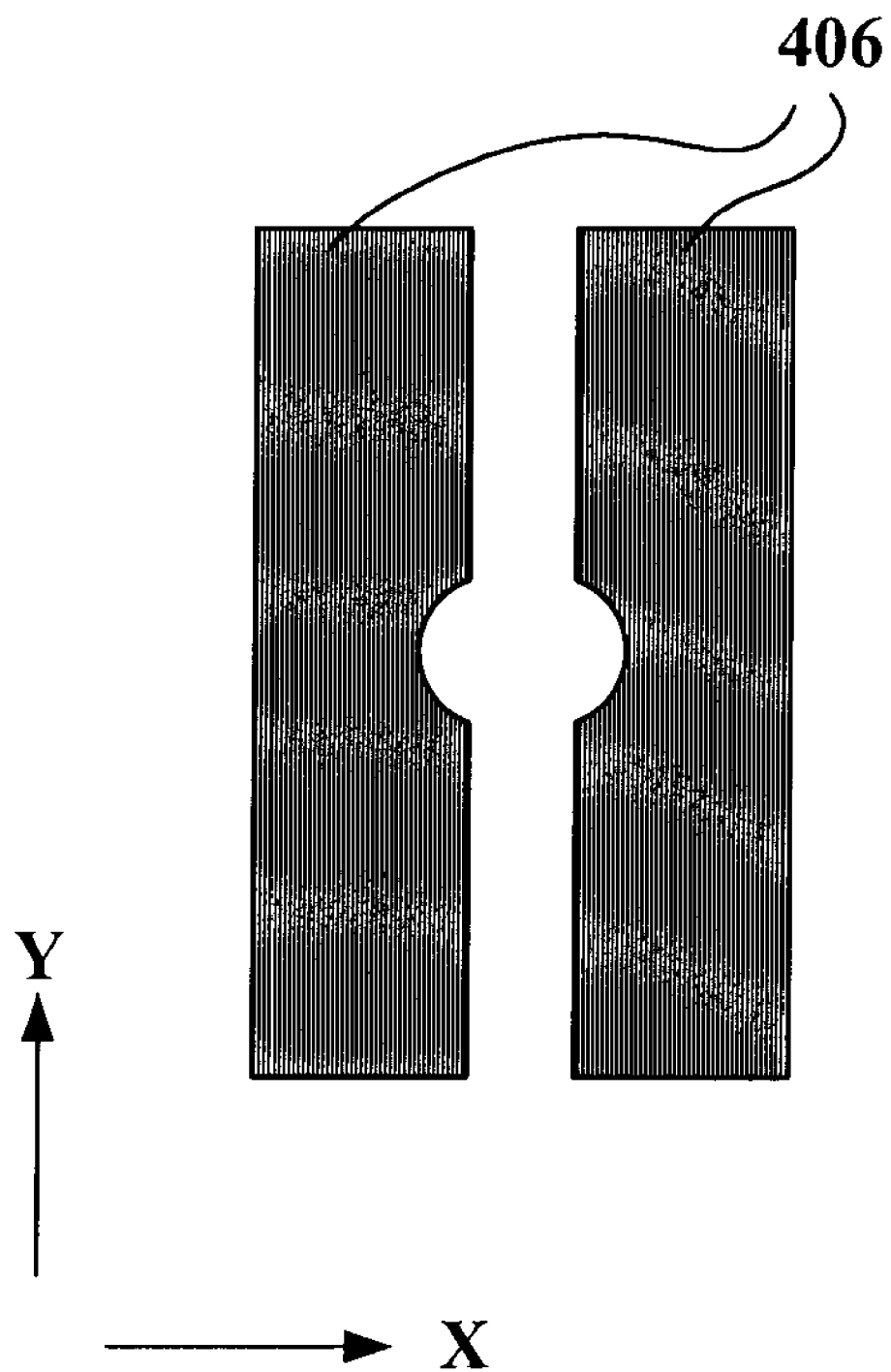
FIG. 8 is a top view showing the pulled-back conductive layer of an embodiment of the present invention.

FIG. 8 illustrates a top view of the second conductive layer 406, showing the local pulled-back profile of the second conductive layer 406.

As illustrated above, the method of the present invention involves a local pull-back process after rapid thermal oxidation. Specifically, an oxide layer, which is formed by the rapid thermal oxidation, is used as a hard mask for forming a gate structure with a local pulled-back conductive layer. Thus, this method not only prevents short circuiting between the conductive layer of the gate structure, bit line contact window, and contact plugs, but also, prevents a CB open and peeling between the conductive layers of the gate structures. In addition, further lithographic and etching processes are not required, thereby, decreasing the thermal budget.

The above disclosure is for illustrating the principles and effects of the present invention and for explaining the inventive features of the invention. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A method of forming a gate structure with a local pulled-back conductive layer, comprising the following steps:
   providing a substrate with a gate structure, wherein the gate structure has a first side wall and a second side wall and comprises the following layers from bottom to top:
   a first conductive layer,
   a second conductive layer, and
   an insulation layer;
   forming a protection layer on the first and second sidewalls of the gate structure to cover the first conductive layer and the second conductive layer;
   removing a portion of the protection layer from the first side wall to expose the second conductive layer; and
   performing an etching to pull-back the exposed second conductive layer.

2. The method of claim 1, wherein the first conductive layer is a polysilicon layer or an amorphous silicon layer.

3. The method of claim 1, wherein the second conductive layer is a metal silicide layer.

4. The method of claim 3, wherein the silicide layer is a tungsten silicide layer.

5. The method of claim 1, wherein the insulation layer is a silicon nitride layer.

6. The method of claim 1, wherein the protection layer is an oxide layer.

7. The method of claim 6, wherein the oxide layer is formed by rapid thermal oxidation.

8. The method of claim 1, further comprising a step of forming a covering layer over the second side wall after the step of forming the protection layer, and a step of removing the covering layer before step of performing the etching.

9. The method of claim 8, wherein the covering layer is a photoresist layer.

10. The method of claim 8, further comprising a step of forming an anti-reflective layer over the gate structure and the substrate before the formation of the covering layer, and a step of removing the anti-reflective layer before the step of performing the etching.

11. The method of claim 10, wherein a portion of the anti-reflective layer is removed from the first side wall before the step of removing a portion of the protection layer, and the first conductive layer is thicker than the remained anti-reflective layer.

12. The method of claim 1, wherein the step removing a portion of the protection layer comprises performing an etching process with a diluted HF.

13. The method of claim 1, wherein the step of performing an etching to pull-back the exposed second conductive layer comprises performing an isotropic etching process.

14. The method of claim 13, wherein an etchant used in the isotropic etching process has an etching rate in the second conductive layer higher than that in the insulation layer, the protection layer, and the first conductive layer.

15. The method of claim 1, wherein the first conductive layer is a polysilicon layer or an amorphous silicon layer, and the second conductive layer is a metal silicide layer, and the step of performing an etching to pull-back the exposed second conductive layer comprises performing an etching process with an etchant comprising NH$_4$OH, H$_2$O$_2$, and H$_2$O.

16. A method of forming a contact window structure with a local pulled-back conductive layer, comprising the following steps:
   providing a substrate having a plurality of gate structures, wherein each of the gate structures comprises the following layers from bottom to top:
   a first conductive layer,
   a second conductive layer, and
   an insulation layer;
   forming a protection layer on a side wall of the each gate structure to cover the first conductive layer and the second conductive layer;
   removing a portion of the protection layer from each of the adjacent side walls of selected adjacent gate structures to expose the second conductive layer of each of the selected adjacent gate structures;
   performing an etching to pull-back the exposed second conductive layer;
   forming a spacer on each side of each selected adjacent gate structure, and forming a dielectric layer over the substrate and the gate structures; and
   removing a portion of the dielectric layer located at a position between the selected adjacent gate structures.

17. The method of claim 16, wherein the first conductive layer is a polysilicon layer or an amorphous silicon layer.

18. The method of claim 16, wherein the second conductive layer is a metal silicide layer.

19. The method of claim 18, wherein the silicide layer is a tungsten silicide layer.

20. The method of claim 16, wherein the protection layer is an oxide layer.

21. The method of claim 20, wherein the oxide layer is formed by rapid thermal oxidation.

22. The method of claim 16, wherein the insulation layer is a silicon nitride layer.

23. The method of claim 16, further comprising a step of forming a covering layer over the gate structures and the substrate after the step of forming the protection layer, and a step of removing the covering layer before step of performing the etching.

24. The method of claim 23, wherein the covering layer is a photoresist layer.

25. The method of claim 23, further comprising a step of forming an anti-reflective layer over the gate structures and the substrate before the formation of the covering layer, and a step of removing the anti-reflective layer before the step of performing the etching.

26. The method of claim 25, wherein a portion of the anti-reflective layer is removed from the adjacent side walls of the selected adjacent gate structures before the step of removing a portion of the protection layer, and the first conductive layer is thicker than the remained anti-reflective layer between the selected adjacent gate structures.

27. The method of claim 16, wherein the step of removing a portion of the protection layer comprises applying a diluted HF to perform an etching process.

28. The method of claim 16, wherein the step of performing an etching to pull-back the exposed second conductive layer comprises performing an isotropic etching process.

29. The method of claim 28, wherein an etchant used in the isotropic etching process has a etching rate in the second conductive layer higher than that in the insulation layer, the protection layer and the first conductive layer.

30. The method of claim 16, wherein the first conductive layer is a polysilicon layer or an amorphous silicon layer, and the second conductive layer is a metal silicide layer, and the step of performing an etching to pull-back the exposed second conductive layer comprises performing an etching process with an etchant comprising $NH_4OH$, $H_2O_2$, and $H_2O$.

31. The method of claim 16, wherein the step of removing a portion of the dielectric layer comprises performing a self-aligned etching process.

* * * * *